United States Patent
Graumann et al.

(10) Patent No.: US 9,325,347 B1
(45) Date of Patent: Apr. 26, 2016

(54) FORWARD ERROR CORRECTION DECODER AND METHOD THEREFOR

(71) Applicant: PMC-Sierra US, Inc., Sunnyvale, CA (US)

(72) Inventors: Peter Graumann, Calgary (CA); Sean Gibb, Calgary (CA)

(73) Assignee: Microsemi Storage Solutions (U.S.), Inc., Aliso Viejo, CA (US)

( * ) Notice: Subject to any disclaimer, the term of this patent is extended or adjusted under 35 U.S.C. 154(b) by 57 days.

(21) Appl. No.: 14/186,786

(22) Filed: Feb. 21, 2014

(51) Int. Cl.
*H03M 13/00* (2006.01)
*H03M 13/11* (2006.01)
*G11B 20/18* (2006.01)
*H03M 13/09* (2006.01)
*H04L 1/00* (2006.01)
*H03M 13/27* (2006.01)

(52) U.S. Cl.
CPC .......... *H03M 13/11* (2013.01); *H03M 13/1111* (2013.01); *H04L 1/0041* (2013.01); *H04L 1/0057* (2013.01); *G11B 20/1833* (2013.01); *H03M 13/09* (2013.01); *H03M 13/27* (2013.01); *H04L 1/0061* (2013.01)

(58) Field of Classification Search
CPC ... H03M 13/11; H03M 13/09; H03M 13/091; H03M 13/27; H04L 1/0057; H04L 1/0041; H04L 1/0061; G11B 20/1833
USPC .................................................. 714/752, 758
See application file for complete search history.

(56) References Cited

U.S. PATENT DOCUMENTS

| | | | | |
|---|---|---|---|---|
| 7,770,090 | B1 * | 8/2010 | Kons et al. | 714/780 |
| 8,266,493 | B1 * | 9/2012 | Abbaszadeh et al. | 714/752 |
| 8,392,789 | B2 * | 3/2013 | Biscondi et al. | 714/755 |
| 8,751,912 | B1 * | 6/2014 | Varnica et al. | 714/785 |
| 8,918,696 | B2 | 12/2014 | Ng et al. | |
| 2005/0204271 | A1 | 9/2005 | Sharon et al. | |
| 2005/0283707 | A1 * | 12/2005 | Sharon et al. | 714/758 |
| 2009/0037791 | A1 * | 2/2009 | Pavlov et al. | 714/752 |
| 2009/0063931 | A1 * | 3/2009 | Rovini et al. | 714/758 |
| 2009/0113256 | A1 * | 4/2009 | Radosavljevic et al. | 714/699 |
| 2010/0122139 | A1 | 5/2010 | Wang et al. | |
| 2011/0246849 | A1 | 10/2011 | Rault et al. | |
| 2012/0036410 | A1 * | 2/2012 | Rault et al. | 714/752 |
| 2013/0139023 | A1 * | 5/2013 | Han et al. | 714/752 |
| 2014/0075264 | A1 | 3/2014 | Han et al. | |

OTHER PUBLICATIONS

U.S. Appl. No. 14/991,323, Office Action dated Feb. 16, 2016.

* cited by examiner

*Primary Examiner* — Albert Decady
*Assistant Examiner* — Osman Alshack
(74) *Attorney, Agent, or Firm* — Dennis R. Haszko

(57) ABSTRACT

A Forward Error Correction (FEC) decoder is provided, for example including a Layered Low Density Parity Check (LDPC) component. In an implementation, power consumption of the LDPC decoder is minimized with minimal to no impact on the error correction performance. This is achieved, in an implementation, by partially or fully eliminating redundant operations in the iterative process.

17 Claims, 6 Drawing Sheets

FORWARD ERROR CORRECTION DECODER AND METHOD THEREFOR

The present disclosure relates generally to forward error correction (FEC) decoders. More particularly, the present disclosure relates to power consumption in FEC decoders including, but not limited to, layered low density parity check (LDPC) decoders.

BACKGROUND

Low Density Parity Code (LDPC) decoders are current generation iterative soft-input forward error correction (FEC) decoders that have found increasing popularity in FEC applications where low error floor and high performance are desired. LDPC decoders are defined in terms of a two-dimensional matrix, referred to as an H matrix, which describes the connections between the data and the parity. The H matrix comprises rows and columns of data and parity information. Decoding an LDPC code requires solving the LDPC code according to the H matrix based on a two-step iterative algorithm. Soft-decoding the code causes convergence of the solved code with the true code; convergence is achieved over a number of iterations and results in a corrected code with no errors.

A category of LDPC codes, known as quasi-cyclic (QC) codes, generates an H matrix with features that improve the ease of implementing the LDPC encoder and decoder. In particular, it is possible to generate a QC-LDPC H matrix where some rows are orthogonal to each other. These orthogonal rows are treated as a layer, and rows within a layer can be processed in parallel, thus reducing the iterative cost of the decoder. It is advantageous to reduce the number of iterations necessary to decode an LDPC code.

FIG. 1 is a block diagram of a known LDPC decoder 100. Noisy data arrives from a channel, as soft information, to the decoder 100 and is typically routed via an input 102 to a main memory 110 in a manner that avoids pipeline stalls. The main memory 110 comprises a plurality of memory elements. In an example implementation, each memory element is a two-port memory supporting one write and one read per clock cycle. Typically these memories will be implemented as two-port register files. A plurality of layer processors 120 are connected to the main memory 110, with each layer processor 120 operating in parallel with the other layer processors. A first adder 122 in the layer processor 120 removes the extrinsic information for the layer in the H matrix currently being operated on.

A check node 130 performs an approximation of the belief propagation method, such as the minsum method. A second adder 124 at the bottom combines the extrinsic information generated by the check node 130 with the channel information for the layer and provides it to the main memory 110 for storage for the next update. The delay element 128 feeds back the extrinsic information for the processing in the next iteration. The layer processors 120 are the dominant source of processing and power consumption in the LDPC decoder. The iterative decode process proceeds based on the specified H matrix until the decode process has completed either by converging to a solution or running out of processing time.

As an LDPC decoder iterates towards a solution, the processing steps in the layer processor 120 generate an increasing number of the same, or very similar, results as compared to previous iterations, resulting in convergence.

FIG. 2 is a graph illustrating convergence for variable and check nodes. FIG. 2 represents the results of an LDPC decoder, in progress with $V_1$ to $V_{N+M}$ representing the variable nodes, and $L_1$ to $L_C$ representing the layers. Shaded columns show the converged variable nodes of an LDPC code word. A variable node is converged when the sign-bit is correct and the magnitude of the data in the node is strong (in a belief propagation network the higher the magnitude of a node the stronger the confidence in that node). Shaded rows show the converged check nodes of an LDPC code word. A check node is converged when the minimum output of the check node is confident. As the variable and check nodes iterate the number of converged nodes increases and the graph above becomes increasingly greyed, until the final iteration when there are very few diffident nodes remaining.

Improvements in FEC decoding are therefore desirable.

BRIEF DESCRIPTION OF THE DRAWINGS

Embodiments of the present disclosure will be described, by way of example, with reference to the drawings and to the following description, in which.

DETAILED DESCRIPTION

Figure 1:
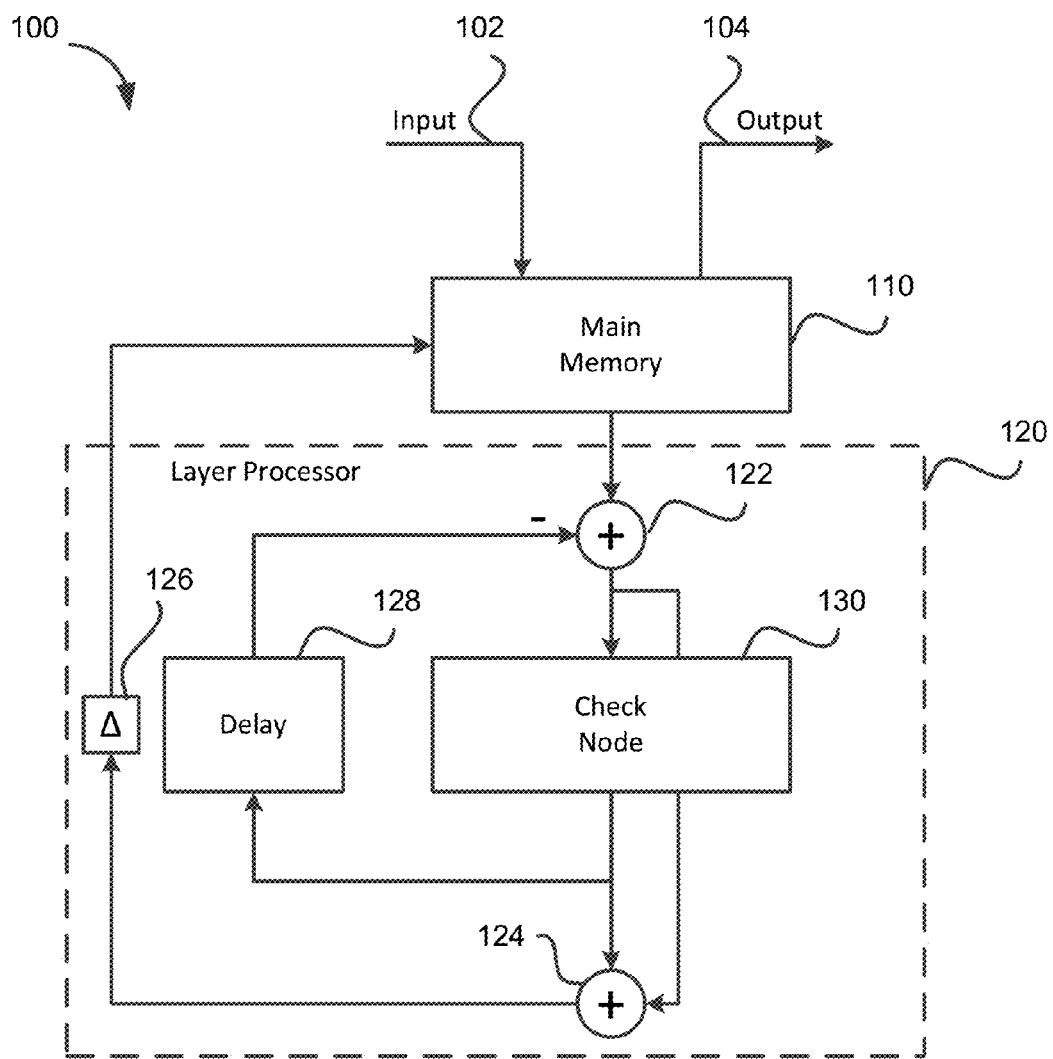
FIG. 1 is a block diagram of a known LDPC decoder.
Figure 2:
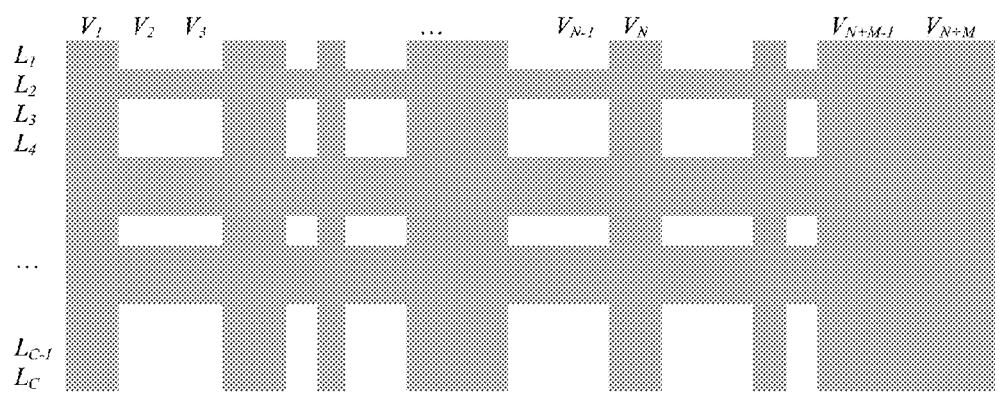
FIG. 2 is a graph illustrating convergence for variable and check nodes.

A Forward Error Correction (FEC) decoder is provided, for example including a Layered Low Density Parity Check (LDPC) component. In an implementation, power consumption of the LDPC decoder is minimized with minimal to no impact on the error correction performance. This is achieved, in an implementation, by partially or fully eliminating redundant operations in the iterative process.

In an embodiment, the present disclosure provides an iterative forward error correction (FEC) decoder configured to perform a set of decoding operations during a selected FEC decode, comprising: a main memory configured to receive an input and to transmit an output; and at least one layer processor. The at least one layer processor comprises: a check node configured to receive a signal based on the main memory output, and to process the received signal based on a message passing method; and a check node convergence tester configured to test for convergence on the check node and to perform only a subset of the set of decoding operations of the FEC decoder in response to a determination that the check node has converged.

In an example embodiment, the iterative FEC decoder comprises a plurality of layer processors and a plurality of check node convergence testers. The plurality of check node convergence testers are equal in number to the plurality of layer processors. Each of the plurality of layer processors comprises a unique one of the plurality of check node convergence testers.

In an example embodiment, the FEC decoder comprises a layered iterative low density parity check (LDPC) decoder, and the set of decoding operations is performed during a selected LDPC decode.

In an example embodiment, the check node convergence tester is configured to disable a portion of the FEC decoder when the check node has converged. In an example embodiment, the check node convergence tester is configured to disable a write-back operation to the main memory when the check node has converged.

In an example embodiment, the decoder further comprises: an adder in communication with the check node and configured to receive a check node output to combine extrinsic information generated by the check node with channel information for the layer and provide the combined information to the main memory for storage for an update; and a delay element configured to feed back the extrinsic information from the check node output for processing in the next iteration. The check node convergence tester is configured to disable a write-back operation to the delay element when the check node has converged.

In an example embodiment, the decoder further comprises an adaptive processing controller configured to receive an output from the check node convergence tester and to provide an output to the main memory. In an example embodiment, the adaptive processing controller comprises a memory element that stores row convergence information from the check node convergence tester. In an example embodiment, the check node convergence tester is configured to omit processing of nodes having a high probability of resulting in no net benefit to convergence.

In an example embodiment, the adaptive processing controller further comprises control circuitry configured to periodically, according to configuration parameters, disable low-power operations. In an example embodiment, the adaptive processing controller skips a current processing step and advances to the next processing step in response to a determination by the check node convergence tester that all rows of a current processing step are marked as converged in the adaptive control memory.

In an example embodiment, the decoder gates off a check node in response to a determination by the check node convergence tester that all rows in the check node have converged. In an example embodiment, the decoder gates off all updates for any row that has converged, in response to a determination by the check node convergence tester that neither the entire processing step has converged nor the rows in the current check node have converged.

In an embodiment, the present disclosure provides a decoding method for an iterative forward error correction (FEC) decoder, the method comprising: receiving, at a check node, a signal based on a main memory output; processing, at the check node, the received signal based on a message passing method; and determining, at a check node convergence tester, whether the check node has converged; and when the FEC decoder is configured to perform a set of decoding operations during a selected FEC decode, performing only a subset of the set of decoding operations of the FEC decoder in response to a determination that the check node has converged.

In an example embodiment, the FEC decoder comprises a layered iterative low density parity check (LDPC) decoder, and wherein the subset of the set of decoding operations is performed during a selected LDPC decode.

In an example embodiment, the method further comprises disabling, using the check node convergence tester, a portion of the FEC decoder when the check node has converged. In an example embodiment, the method further comprises disabling, using the check node convergence tester, a write-back operation to the main memory when the check node has converged. In an example embodiment, the method further comprises disabling, using the check node convergence tester, a write-back operation to the delay element when the check node has converged.

In an example embodiment, the method further comprises receiving, at an adaptive processing controller, an output from the check node convergence tester and providing an output to the main memory. In an example embodiment, the method further comprises omitting processing, at the check node convergence tester, of nodes having a high probability of resulting in no net benefit to convergence.

Other aspects and features of the present disclosure will become apparent to those ordinarily skilled in the art upon review of the following description of specific embodiments in conjunction with the accompanying figures.

While example embodiments relating to LDPC decoders will be described in detail herein, in other embodiments the features are provided in any type of FEC decoder.

Simulation results show that approximately 40% of the efforts expended by a known FEC or LDPC decoder during a typical decode is redundant effort, and is not required for convergence. Given that the layer processor accounts for the bulk of the processing in an FEC decoder, the redundant work done after a variable and check node converges is expending power with no net benefit to the overall decoder convergence. An FEC or LDPC decoder according to an embodiment of the present disclosure presents several opportunities to exploit these redundancies.

Embodiments of the present disclosure provide a type of FEC decoder, such as an LDPC decoder, that can be used to reduce the redundant operations and thereby reduce the power, and in one embodiment also improve the throughput of the decode operation. The decoder achieves these improvements without degrading the performance by disabling some portion of the LDPC decoder when a check node has converged. There are two embodiments described in the present disclosure for achieving these results. In the first embodiment, the delay and main memory write back is omitted if the check node has converged. This results in a power improvement. In the second embodiment, the processing of nodes with a high probability of resulting in a useless operation can be omitted, resulting in a power and potentially a throughput improvement.

In order to power down operations when a check node has converged, a test is employed that will allow testing for convergence on the node. A reasonable approach to determining if a check node has converged takes a form similar to that in Equation 1:

$$\min_{1 < r \leq N_C} (|C_{j,r}|) > T_C \qquad \text{Equation 1}$$

where $N_C$ is the number of check node outputs, $C_{j,r}$ is the check node outputs for the j-th check node and $T_C$ is a constant threshold value. When the minimum output magnitude for the j-th check node exceeds the threshold value, $T_C$, then the j-th check node has potentially stabilized and can be a candidate for power control.

Figure 3:
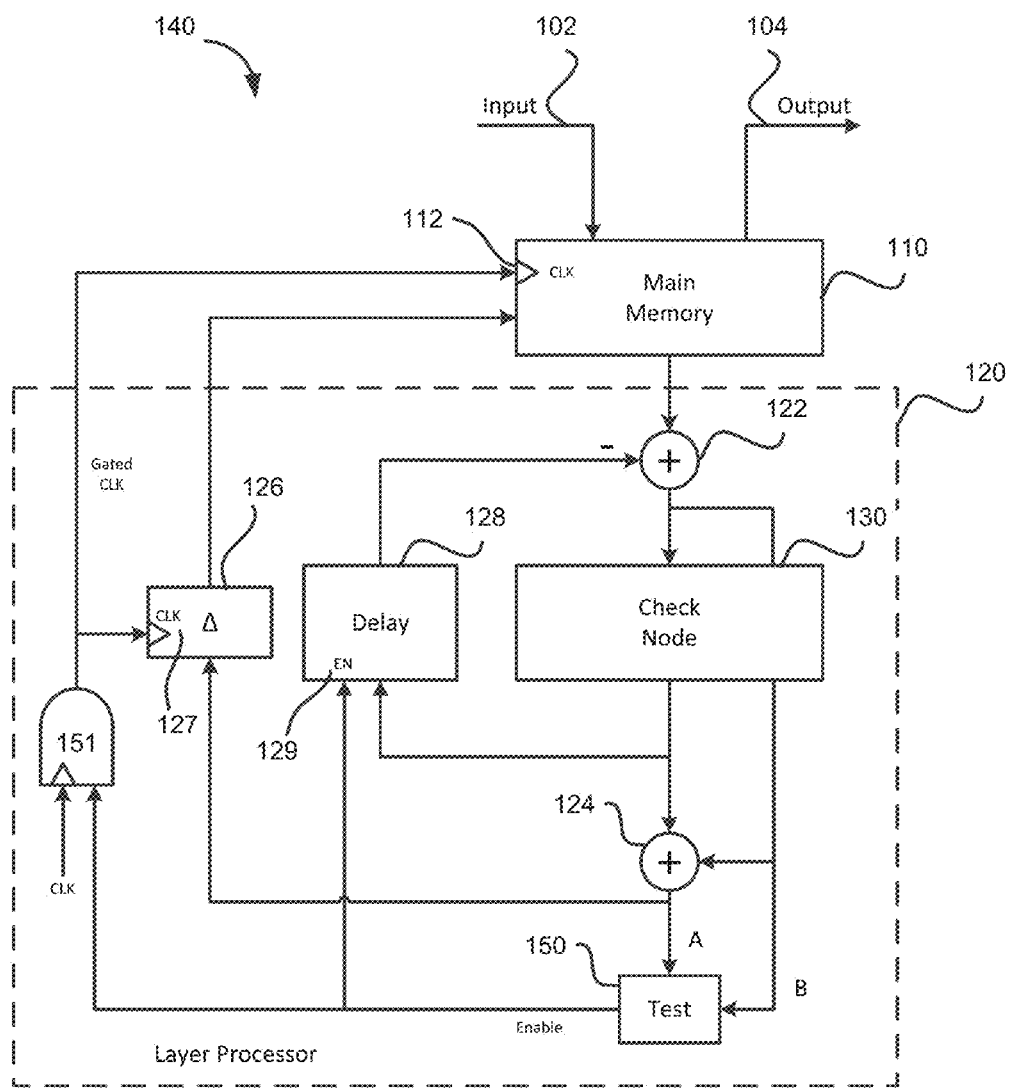
FIG. 3 is a block diagram of a decoder according to an embodiment of the present disclosure implementing memory gate-off.

FIG. 3 is a block diagram of a decoder according to an embodiment of the present disclosure implementing memory gate-off, which reduces the power usage of the decoder. In FIG. 3, an iterative forward error correction (FEC) decoder 140 is configured to perform a set of decoding operations during a selected FEC decode. The decoder 140 comprises a main memory 110 configured to receive an input 102 and to transmit an output 104. The decoder 140 comprises at least one layer processor comprising a check node 130 and a check node convergence tester 150. The check node 130 is configured to receive a signal based on the main memory output, and to process the received signal based on a message passing method, or belief propagation method.

The check node convergence tester 150 is configured to test for convergence on the check node 130 and to perform only a subset of the set of decoding operations of the FEC decoder in response to a determination that the check node has converged. In an example embodiment, the check node convergence tester 150 is configured to disable a portion of the FEC decoder when the check node has converged. For example, in the embodiment of FIG. 3, the check node convergence tester 150 is configured to disable a write-back operation to the main memory 110 when the check node has converged. In another example embodiment, the check node convergence tester 150 is configured to disable a write-back operation to the delay element 128 when the check node has converged.

In an example embodiment, the iterative FEC decoder 140 comprises a plurality of layer processors 120 and a plurality of check node convergence testers 150. The plurality of check node convergence testers 150 is equal in number to the plurality of layer processors 120, with each of the plurality of layer processors 120 comprising a unique one of the plurality of check node convergence testers 150. In an example embodiment, the FEC decoder 140 comprises a layered iterative low density parity check (LDPC) decoder, and the set of decoding operations is performed during a selected LDPC decode.

In the embodiment of FIG. 3, the test for convergence takes the form in Equation 2:

$$\text{Test}=\min(|A|)>T_C \cap \text{sgn}(A)=\text{sgn}(B) \qquad \text{Equation 2}$$

When both test conditions are true, the main memory 110, the final registers 126 in the logical pipeline, and the delay element 128 can be disabled. The connection between the check node convergence tester 150 and the elements it can disable are indicated by the dashed lines. In an example embodiment, the final registers 126 in the logical pipeline (as indicated by Δ) are disabled by clock gating block 151. In addition, the bit-writable delay memory element update is disabled by either gating the clock 127 to the memory elements or by preventing write-back operation. Similarly the write-back to the bit-writable main memory can be either clock gated by gating the clock 112 of the main memory, or no write-back data can be provided.

With respect to FIG. 3, in the event of a successful convergence test, one or more of the following actions are taken: i) nothing is written back to delay element 128; write enable 129 to this memory 128 is turned off, saving write-back power; ii) delay pipeline element 126 is not updated, either by gating the clock 127 to the register, or by letting the register maintain state; gating off the clock saves clock and data toggling power; iii) nothing is written back to memory element 110. In another embodiment, the functionality of the clock gating block 151 can instead be provided by gating a write-enable to the main memory 110, such as by a write disable.

Figure 4:
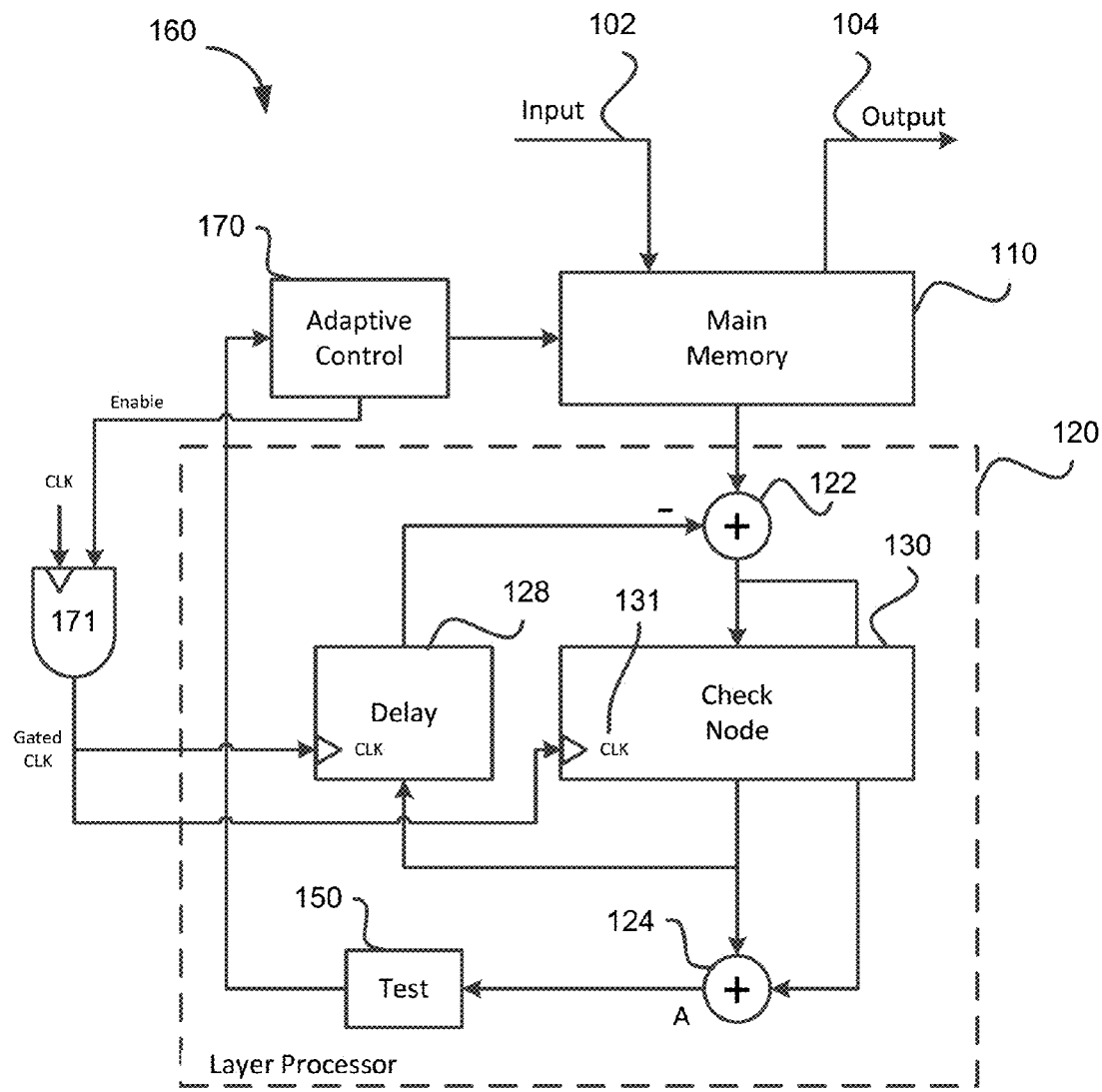
FIG. 4 is a block diagram of a decoder according to another embodiment of the present disclosure implementing reduced node processing.

FIG. 4 is a block diagram of a decoder 160 according to another embodiment of the present disclosure implementing reduced node processing, which reduces the power and enhances the throughput of the decoder. In the decoder 160, which is an iterative FEC decoder, the main memory 110, the adders 122 and 124, the delay element 128 and the check node 130 are similar to the corresponding elements in FIG. 3, which have been previously described.

The check node convergence tester 150, similar to FIG. 3, is configured to test for convergence on the check node 130 and to perform only a subset of the set of decoding operations of the FEC decoder in response to a determination that the check node has converged. In an example embodiment, the check node convergence tester 150 is configured to disable a portion of the FEC decoder when the check node has converged.

In the embodiment of FIG. 4, the iterative FEC decoder further comprises an adaptive processing controller 170 configured to receive an output from the check node convergence tester 150 and to provide an output to the main memory 110. In an example embodiment according to FIG. 4, the check node convergence tester 150 is configured to omit processing of variable nodes and check nodes having a high probability of resulting in no net benefit to convergence. In other words, variable nodes and check nodes whose outputs are redundant with respect to convergence, or have no effective contribution to convergence, will be omitted from processing.

In the embodiment of FIG. 4, the test for convergence, as shown below in Equation 3, is executed just before writing back the results of the layer processor 120 to the main memory 110.

$$\text{Test}=\min(|A|)>T_C \qquad \text{Equation 3}$$

In this case, the check node convergence tester 150 feeds into an adaptive processing controller 170. The adaptive processing controller 170 comprises a memory element that stores row convergence information from the check node convergence tester 150.

In another embodiment according to FIG. 4, the simpler test from Equation 2 could alternatively be used as the convergence test criteria.

With respect to FIG. 4, in an embodiment in which only a single node is turned off, clock 131 is gated off to the entire layered check node 130, using clock gating block 171, and any memory updates are disabled. In an embodiment in which an entire processing step is skipped, the connection from 170 to 110 is used to pull only portions of interest of the current FEC block.

Figure 5:
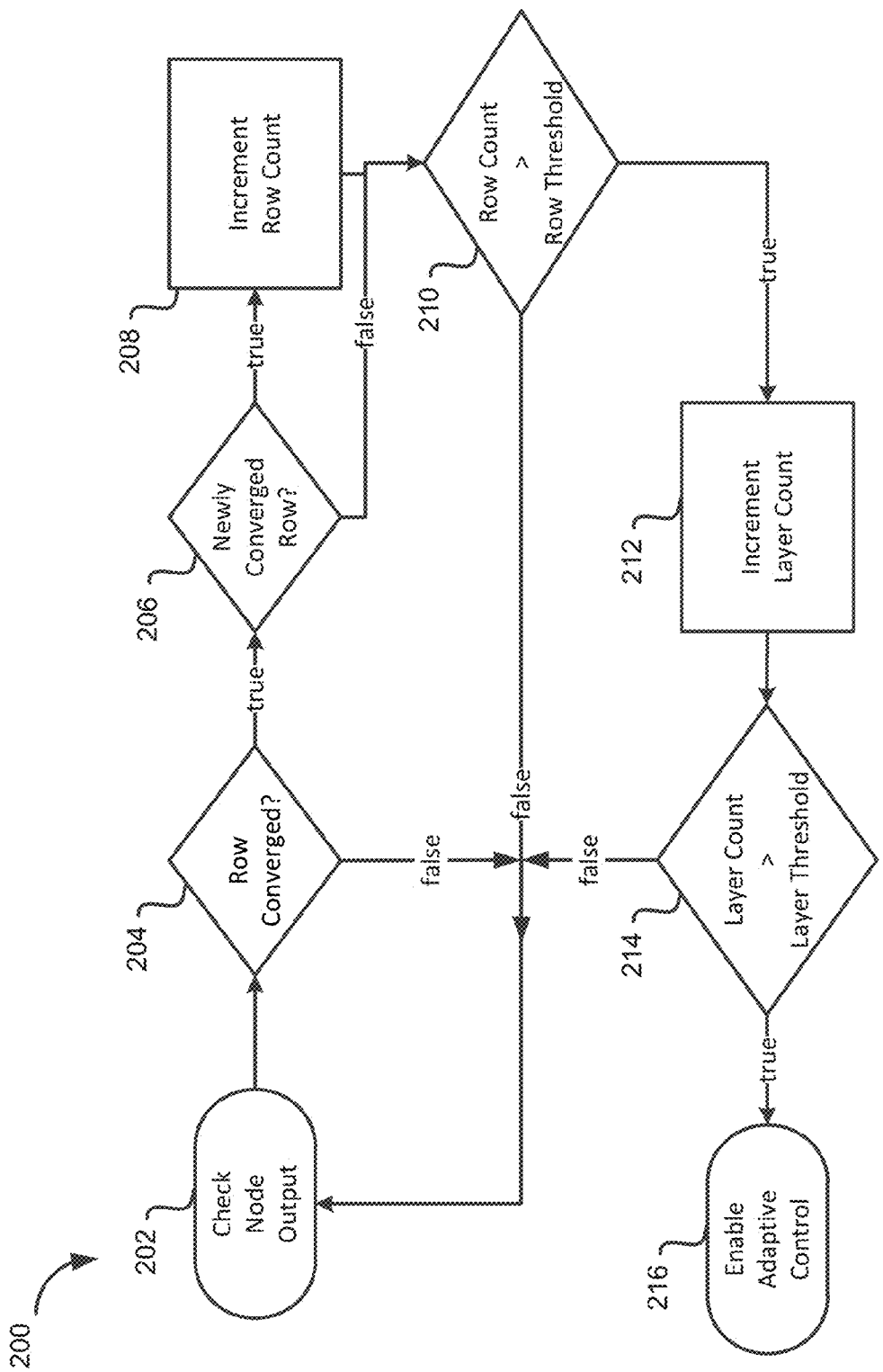
FIG. 5 is flowchart illustrating a method of adaptive control in a decoder in accordance with an embodiment of the present disclosure.

FIG. 5 is flowchart illustrating a method 200 of adaptive control in a decoder in accordance with an embodiment of the present disclosure. As shown in FIG. 5, when a sufficient number of rows have converged for a specified number of layers, the adaptive control enables power and processing reduction measures.

At step 202, a check node output is obtained. In step 204, a determination is made whether the row has converged. If the determination in 204 is false, the method returns to 202. If the determination in 204 is true, the method proceeds to step 206 in which a determination is made whether the converged row is a newly converged row. If the determination in 206 is true, then the row count is incremented; if the determination in 206 is false, the row count is not incremented. The method the proceeds to step 210, in which a determination is made whether the row count is greater than a row threshold. If the determination in 210 is true, then the layer count is incremented in step 212; if the determination in 210 is false, the method returns to 202. After step 212, a determination is made in step 214 whether the layer count is greater than the layer threshold. If the determination in 214 is true, then adaptive control is enabled in step 216. If the determination in 214 is false, the method returns to 202.

On iterations following enable adaptive control in 216, the adaptive controller 170 has three options for reducing power and processing. If all rows of a current processing step are marked as converged in the adaptive control memory, then the adaptive controller 170 can skip the current processing step and advance to the next processing step. In the event that all rows in the current processing step have not converged, it is still possible to gate off a check node where all rows in the check node have converged. If neither the entire processing step has converged nor the rows in the current check node have converged it is still possible to gate off all updates for any row that has converged. In order to ensure that the code does not get locked into a poor convergence state, periodically a complete iteration without power and processing adaptation can be executed in order to verify the veracity of the current adaptive control information. Additionally, the adaptive control mechanism can be fully disabled after a specified number of iterations to improve FER performance without significantly increasing power consumption.

Figure 6:
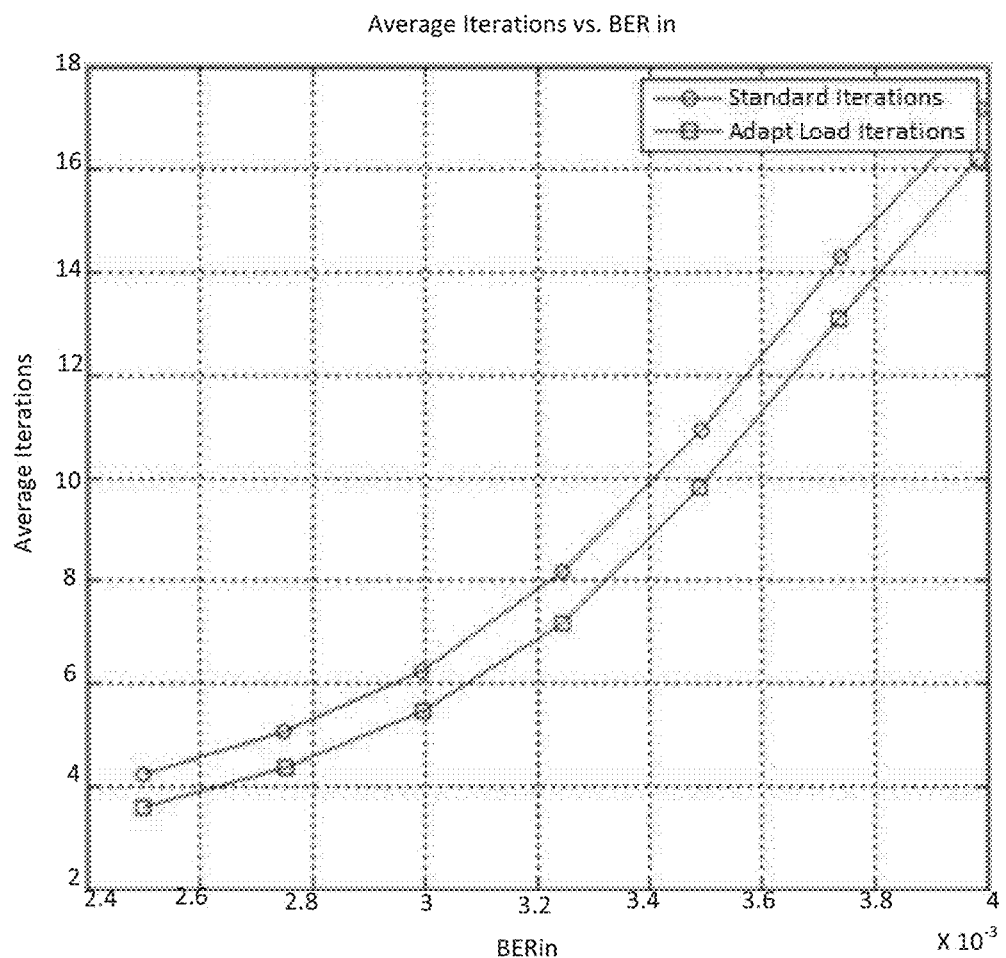
FIG. 6 is a graph comparing bit error rate from standard iterations with iterations according to an embodiment of the present disclosure.

The effect of the adaptive load method illustrated in FIG. 5 and described above, on required iterations of decoding is shown in FIG. 6. FIG. 6 shows a graph 220 comparing bit error rate from standard iterations with iterations according to an embodiment of the present disclosure. The plot shows that the Adaptive Load method reduces the iterations of decoding by ~15% and during these runs the FER performance was unchanged. For plotting purposes, operations that are skipped are removed from the iteration count in the plot. In the implementation of this method the iterations would appear unchanged but during operation ~15% of the operation would be power gated off and so not performed.

Simulations in the LDPC system model indicate that up to 40% of the operations performed by an LDPC decoder are redundant and suitable for bypassing in order to save power. Methods and decoders according to embodiments of the present disclosure allow the power to be reduced with various trade-offs between power reduction and implementation complexity. The gate-off methods described in relation to FIG. 3 will reduce power consumption by up to 20%. The reduced node adaptive control architecture presented in relation to FIG. 4 shows it is possible to increase the throughput and reduce the power consumption by 20% without significantly impacting the frame error rate performance. By tweaking the magnitude threshold, the number of rows that must be converged and the number of layers the row count must be converged it is possible to trade-off the power savings versus the frame error rate performance.

Embodiments of the present disclosure are applicable in any communication systems that employ forward error correction, such as LDPC forward error correction, and are especially well suited to high throughput systems. Embodiments of the present disclosure may be implemented as an Application Specific Integrated Circuit (ASIC). For example, embodiments of the present disclosure can be employed in systems such as, but not limited to: Optic Fiber based Metro and Wide Area Networks (MANs and WANs); Flash memory Physical Layer; and Wireless communications standards that employ FEC or LDPC decoders.

Embodiments of the present disclosure achieve reduced power consumption for FEC decoders without sacrificing FER performance. In some cases, increased throughput while FEC decoding can also be obtained without sacrificing FER performance.

In the present disclosure, an FEC decoder is provided that exhibits reduced power consumption relative to a standard FEC decoder method. Lower power consumption is obtained by skipping redundant operations within the iterative FEC decoder. In some embodiments, it is possible to skip processing some operations completely resulting in both power savings and improved throughput.

In an aspect, an FEC decoder includes circuitry to adaptively decrease power consumption during iterative decoding, or to adaptively increase throughput during iterative decoding, or both. In an embodiment, the FEC decoder comprises: an iterative LDPC decoder implementation, including an input-output memory unit and a plurality of check node processors; and a power-down processor comprising: test circuitry to determine check node convergence; gate-off circuitry to disable some or all of the processing elements in the LDPC decoder; and an adaptive controller comprising a memory unit to store the convergence state of each check node in the LDPC code, control circuitry to enable low-power operations according the previous convergence state recorded in the memory unit, control circuitry to alter the flow of the main decoder to skip processing some nodes that have already converged, and control circuitry to periodically, according to configuration parameters, disable low-power operations. In another embodiment, a power-down processor comprises: test circuitry to determine check node convergence; gate-off circuitry to disable some or all of the processing elements in the decoder; and control circuitry to periodically, according to configuration parameters, disable low-power operations.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure may be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations may also be stored on the machine-readable medium. The instructions stored on the machine-readable medium may be executed by a processor or other suitable processing device, and may interface with circuitry to perform the described tasks.

The above-described embodiments are intended to be examples only. Alterations, modifications, and variations may be effected to the particular embodiments by those of skill in the art without departing from the scope, which is defined solely by the claims appended hereto.

What is claimed is:

1. An iterative forward error correction (FEC) decoder configured to perform a set of decoding operations during a selected FEC decode, comprising:
   a main memory configured to receive an input and to transmit an output;
   a plurality of check node convergence testers;
   a plurality of layer processors, each layer processor comprising:
      a check node configured to receive a signal based on the main memory output, and to process the received signal based on a message passing method; and a unique check node convergence tester, from among the plurality of check node convergence testers, configured to test for convergence on the check node;
wherein the layer processor performs only a subset of the set of decoding operations of the layer processor in response to a determination that the check node of the layer processor has converged;
wherein the plurality of check node convergence testers is equal in number to the plurality of layer processors;
an adder in communication with the check node and configured to receive a check node output to combine extrinsic information generated by the check node with channel information for the layer and provide the combined information to the main memory for storage for an update; and
a delay element configured to feed back the extrinsic information from the check node output for processing in the next iteration;
wherein the check node convergence tester is configured to disable a write-back operation to the delay element when the check node has converged.

2. The decoder of claim 1 wherein the FEC decoder comprises a layered iterative low density parity check (LDPC) decoder, and wherein the set of decoding operations is performed during a selected LDPC decode.

3. The decoder of claim 1 wherein the check node convergence tester is configured to disable a portion of the layer processor when the check node has converged.

4. The decoder of claim 1 wherein the check node convergence tester is configured to disable a write-back operation to the main memory when the check node has converged.

5. The decoder of claim 1 further comprising an adaptive processing controller configured to receive an output from the check node convergence tester and to provide an output to the main memory.

6. The decoder of claim 5 wherein the adaptive processing controller comprises a memory element that stores row convergence information from the plurality of check node convergence testers.

7. The decoder of claim 5 wherein the check node convergence tester is configured to omit processing of nodes having a high probability of resulting in no net benefit to convergence.

8. The decoder of claim 5 wherein the adaptive processing controller further comprises control circuitry configured to periodically, according to configuration parameters, disable low-power operations.

9. The decoder of claim 5 wherein the adaptive processing controller skips a current processing step and advances to the next processing step in response to a determination by the check node convergence tester that all rows of a current processing step are marked as converged in the adaptive control memory.

10. The decoder of claim 5 wherein the decoder gates off a check node in response to a determination by the check node convergence tester that all rows in the check node have converged.

11. The decoder of claim 5 wherein the decoder gates off all updates for any row that has converged, in response to a determination by the check node convergence tester that neither the entire processing step has converged nor the rows in the current check node have converged.

12. A decoding method for an iterative forward error correction (FEC) decoder having a plurality of layer processors and a plurality of check node convergence testers, the plurality of check node convergence testers being equal in number to the plurality of layer processors, each of the plurality of layer processors comprising a check node, and adder in communication with the check node, a delay element, and a unique one of the plurality of check node convergence testers, the method comprising:
for each of the plurality of layer processors:
receiving, at the check node of the layer processor, a signal based on a main memory output;
processing, at the check node, the received signal based on a message passing method; and
determining, at the check node convergence tester of the layer processor, whether the check node has converged; and
when the FEC decoder is configured to perform a set of decoding operations during a selected FEC decode, for each layer processor for which the check node is determined to have converged:
performing only a subset of the set of decoding operations of the layer processor in response to a determination that the check node of the layer processor has converged;
at the adder in communication with the check node:
receiving a check node output;
combining extrinsic information generated by the check node with channel information for the layer; and
providing the combined information to the main memory for storage for an update;
feeding back, by the delay element, the extrinsic information from the check node output for processing in the next iteration; and
disabling, using the check node convergence tester, a write-back operation to the delay element when the check node has converged.

13. The method of claim 12 wherein the FEC decoder comprises a layered iterative low density parity check (LDPC) decoder, and wherein the subset of the set of decoding operations is performed during a selected LDPC decode.

14. The method of claim 12 further comprising disabling, using the check node convergence tester, a portion of the layer processor when the check node has converged.

15. The method of claim 12 further comprising disabling, using the check node convergence tester, a write-back operation to the main memory when the check node has converged.

16. The method of claim 12 further comprising receiving, at an adaptive processing controller, an output from the check node convergence tester and providing an output to the main memory.

17. The method of claim 12 further comprising omitting processing, at the check node convergence tester, of nodes having a high probability of resulting in no net benefit to convergence.

* * * * *